United States Patent
Yanagisawa et al.

(10) Patent No.: US 7,943,528 B2
(45) Date of Patent: May 17, 2011

(54) SUBSTRATE PROCESSING APPARATUS AND SEMICONDUCTOR DEVICES MANUFACTURING METHOD

(75) Inventors: Yoshihiko Yanagisawa, Toyama (JP); Mitsuro Tanabe, Toyama (JP); Harunobu Sakuma, Toyama (JP); Tadashi Takasaki, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/868,089

(22) Filed: Aug. 25, 2010

(65) Prior Publication Data

US 2011/0053382 A1    Mar. 3, 2011

(30) Foreign Application Priority Data

Aug. 31, 2009  (JP) ................................. 2009-200668
Jun. 25, 2010  (JP) ................................. 2010-144975

(51) Int. Cl.
*H01L 21/46*     (2006.01)
(52) U.S. Cl. ................................. 438/758; 257/E21.17
(58) Field of Classification Search ............. 257/E21.17; 438/758
See application file for complete search history.

(56) References Cited

U.S. PATENT DOCUMENTS

| 2009/0223926 A1* | 9/2009 | Hirano ............................ 216/61 |
| 2009/0242127 A1* | 10/2009 | Koshimizu et al. ...... 156/345.28 |
| 2009/0255631 A1* | 10/2009 | Sato ........................ 156/345.43 |
| 2010/0183827 A1* | 7/2010 | Hirayama et al. ............ 427/575 |
| 2010/0248489 A1* | 9/2010 | Koguchi et al. ............... 438/714 |
| 2010/0269980 A1* | 10/2010 | Nishimura et al. ...... 156/345.48 |

FOREIGN PATENT DOCUMENTS

JP          2004-95940 A      3/2004

* cited by examiner

*Primary Examiner* — Thao P. Le
(74) *Attorney, Agent, or Firm* — Mattingly & Malur, P.C.

(57) ABSTRACT

Substrate processing of a substrate is performed in a processing chamber and the evenness in in-plane film thickness is enhanced. An exhaust unit exhausts the atmosphere in the processing chamber and a processing gas is supplied that is excited by an exciting unit. A rotational drive unit horizontally rotates a support unit that supports a mounting substrate on which the substrate is mounted; and a coolant supply/discharge unit is connected to the lower end of the support unit through a connecting unit. The substrate mounting unit has a coolant circulation path therein. The support unit includes a first coolant flow path for passing coolant through the coolant circulation path. The coolant supply/discharge unit includes a second coolant flow path. The connecting unit connects the first coolant flow path and the second coolant flow path together and is provided outside the processing chamber.

13 Claims, 7 Drawing Sheets

US 7,943,528 B2

SUBSTRATE PROCESSING APPARATUS AND SEMICONDUCTOR DEVICES MANUFACTURING METHOD

BACKGROUND OF THE INVENTION

1. Field of the Invention

The present invention relates to substrate processing technologies for exciting processing gas to process a substrate and in particular to a substrate processing apparatus and a semiconductor devices manufacturing method which are effective in the formation of, for example, an oxide film or the like over a semiconductor substrate (for example, a semiconductor wafer) in which a semiconductor integrated circuit (hereafter, referred to as IC) by deposition and the like.

2. Description of Related Art

In processes for manufacturing ICs, a film is formed over the surface of a substrate by various methods using processing gas. In the CVD (Chemical Vapor Deposition) method described in Japanese Unexamined Patent Publication No. 2004-95940, for example, vapor phase reaction is used to carryout film deposition and the like. To realize vapor phase reaction, processing gas is excited or decomposed by heating, plasma processing, application of microwaves or ultra violet light, or the like.

SUMMARY OF THE INVENTION

The CVD method is especially required to make the in-plane film thickness of a substrate even.

It is an object of the invention to form a film even in in-plane film thickness (the thickness of a film formed over the surface of a single substrate) when the film is formed over the substrate by a CVD method or the like.

The following is a brief description of the gist of the representative elements of the invention related to a substrate processing apparatus laid open in this application:

A substrate processing apparatus includes:

a processing chamber for processing a substrate mounted on a substrate mounting unit;

a supply unit for supplying processing gas into the processing chamber;

an exciting unit for exciting supplied processing gas;

an exhaust unit for exhausting the atmosphere in the processing chamber;

a support unit for supporting the substrate mounting unit;

a rotational drive unit for horizontally rotating the support unit; and a coolant supply/discharge unit that is connected with the lower end of the support unit through a connecting unit and is not horizontally rotated.

The substrate mounting unit has a coolant circulation path therein.

The support unit includes a first coolant supply path for supplying coolant to the coolant circulation path and a first coolant discharge path for discharging coolant from the coolant circulation path.

The coolant supply/discharge unit includes a second coolant supply path and a second coolant discharge path.

The connecting unit connects the first coolant supply path and the second coolant supply path together and connects the first coolant discharge path and the second coolant discharge path together.

The connecting unit is provided outside the processing chamber.

The following is a brief description of the gist of the representative elements of the invention related to a semiconductor devices manufacturing method laid open in this application:

A semiconductor devices manufacturing method is for a substrate processing apparatus including: a processing chamber for carrying out film formation processing on a semiconductor substrate mounted on a substrate mounting unit; a supply unit for supplying processing gas into the processing chamber; an exciting unit for exciting supplied processing gas; an exhaust unit for exhausting the atmosphere in the processing chamber; a support unit for supporting the substrate mounting unit; a rotational drive unit for horizontally rotating the support unit; and a coolant supply/discharge unit that is connected with the lower end of the support unit through a connecting unit and is not horizontally rotated, the substrate mounting unit having a coolant circulation path therein, the support unit including a first coolant supply path for supplying coolant to the coolant circulation path and a first coolant discharge path for discharging coolant from the coolant circulation path, the coolant supply/discharge unit including a second coolant supply path and a second coolant discharge path, the connecting unit connecting the first coolant supply path and the second coolant supply path together and connecting the first coolant discharge path and the second coolant discharge path together, and the connecting unit being provided outside the processing chamber.

The semiconductor devices manufacturing method includes the steps of:

carrying a semiconductor substrate into the processing chamber;

supplying processing gas into the processing chamber;

circulating coolant in the substrate mounting unit and horizontally rotating the substrate mounting unit;

exciting processing gas to carry out film formation processing on the substrate; and carrying the substrate out of the processing chamber.

When a semiconductor devices manufacturing method and a substrate processing apparatus are configured as mentioned above, a film with enhanced evenness in in-plane film thickness can be formed over a substrate.

DETAILED DESCRIPTION OF THE PREFERRED EMBODIMENTS

Figure 1:
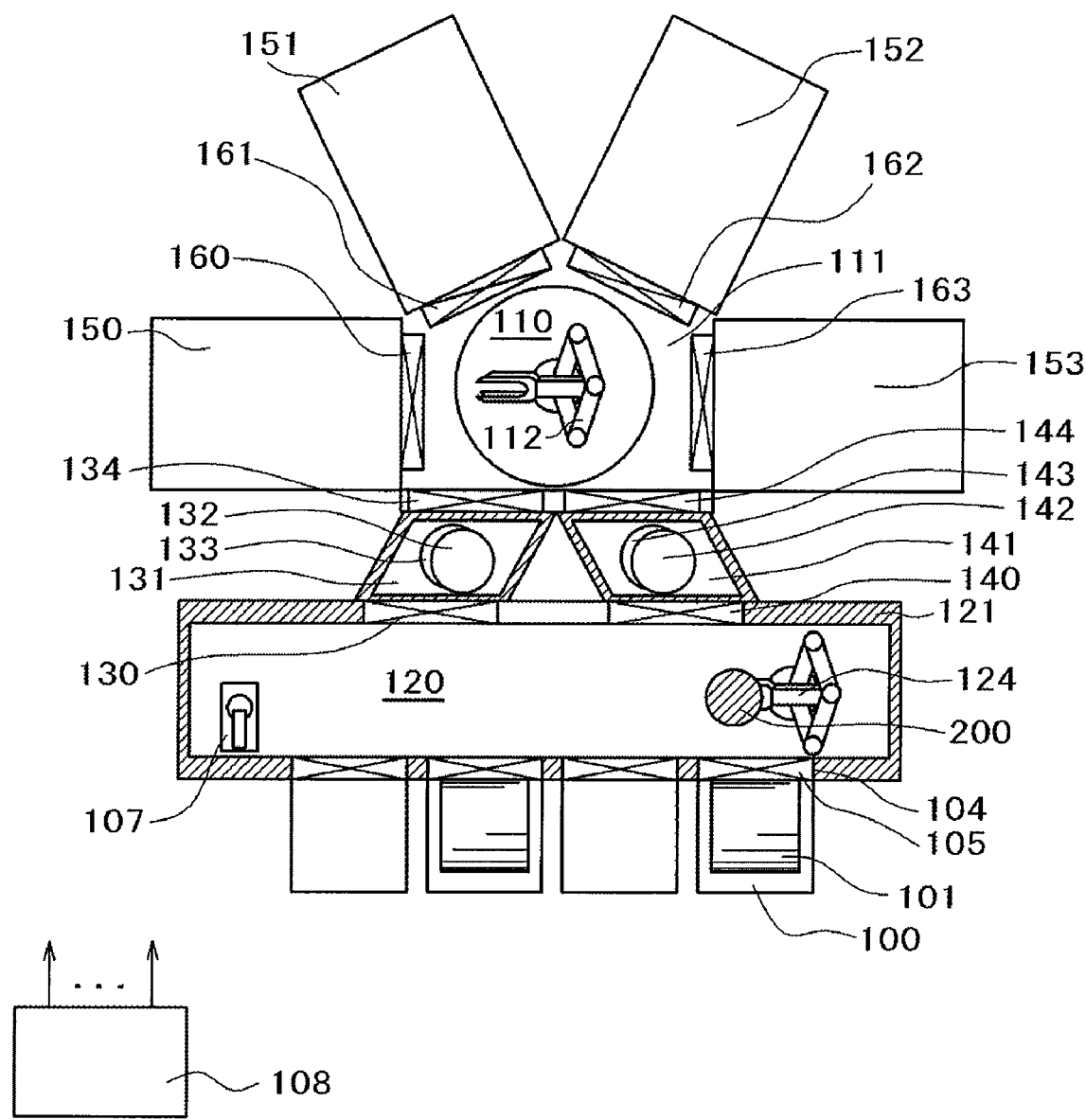
FIG. 1 is a sectional view of a substrate processing apparatus in embodiments of the invention as viewed from above.

Description will be given to a substrate processing apparatus in the first to third embodiments of the invention with reference to FIG. 1 and FIG. 2. FIG. 1 illustrates the substrate processing apparatus viewed from above and FIG. 2 illustrates the substrate processing apparatus viewed sideways.

In substrate processing apparatuses to which the invention is applied, FOUP (Front Opening Unified Pod; hereafter, referred to as pod) is used as a carrier for conveying substrates such as wafers. In the following description, the front and rear and left and right directions are taken on the basis of FIG. 1. That is, front direction refers to the direction of a second conveying chamber 120 as viewed from a first conveying chamber 110; rear direction refers to the direction of the first conveying chamber 110 as viewed from the second conveying chamber 120; left direction refers to the direction of a processing chamber 150 as viewed from the first conveying chamber 110; and right direction refers to the direction of a processing chamber 153 as viewed from the first conveying chamber 110.

Figure 2:
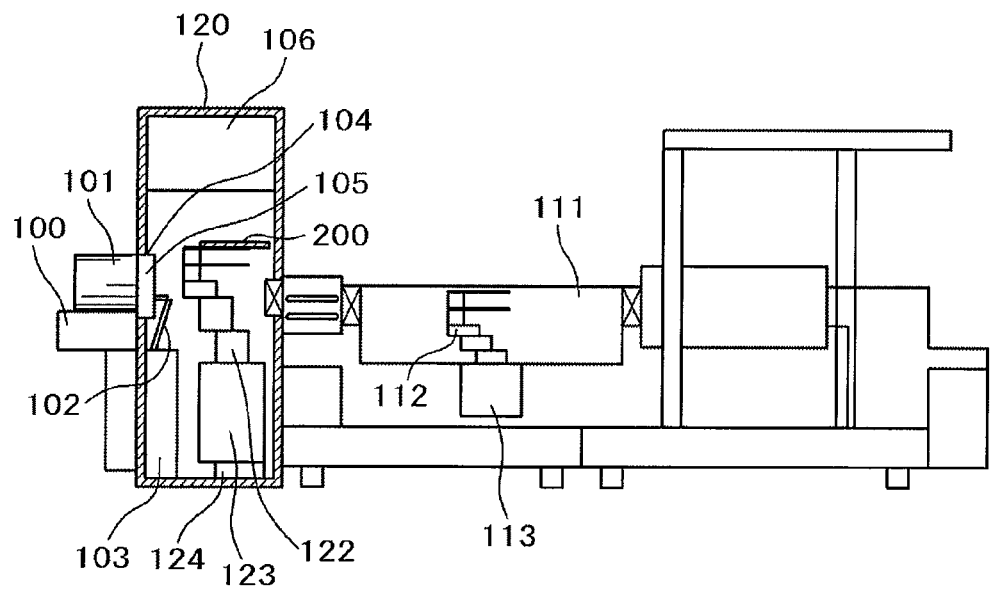
FIG. 2 is a sectional view of a substrate processing apparatus in embodiments of the invention as viewed sideways.

As illustrated in FIG. 1 and FIG. 2, the substrate processing apparatus includes the first conveying chamber 110. The first conveying chamber 110 is so structured that it withstands a pressure (negative pressure) equal to or lower than the atmospheric pressure, including vacuum. The enclosure 111 of the first conveying chamber 110 is formed in the shape of a box that is closed and in a pentagonal shape as viewed in a plane (shape viewed from above). In the first conveying chamber 110, there is installed a first wafer transfer device 112. The first wafer transfer device 112 is capable of simultaneously transferring two wafers 200 under negative pressure. The first wafer transfer device 112 is so configured that it can be moved up and down by an elevator 113 with the first conveying chamber 110 kept air-tight.

Of the five side walls of the enclosure 111 of the first conveying chamber, one side wall located on the front side is coupled with load lock chambers 131 and 141 respectively through gate valves 134, 144. The load lock chambers 131 and 141 are so structured that they withstand negative pressure. In the load lock chamber 131, there are installed temporary substrate mounting tables 132, 133 for temporarily mounting substrates; and in the load lock chamber 141, there are installed temporary substrate mounting tables 142, 143.

The load lock chamber 131 and the load lock chamber 141 are coupled on their front side with the second conveying chamber 120 used under substantially the atmospheric pressure, through gate valves 130, 140. In the second conveying chamber 120, there is installed a second wafer transfer device 122. The second wafer transfer device 122 is capable of simultaneously transferring two wafers 200. The second wafer transfer device 122 is moved up and down by an elevator 123 installed in the second conveying chamber 120 and furthermore moved in the left and right directions by a linear actuator 124.

As illustrated in FIG. 1, a notch aligner 107 is installed at the left part of the interior of the second conveying chamber 120. As illustrated in FIG. 2, a clean unit 106 for supplying clean air is installed at the upper part of the second conveying chamber 120.

As illustrated in FIG. 1 and FIG. 2, the enclosure 121 of the second conveying chamber 120 is provided with: a wafer carry-in/out port 104 for carrying wafers 200 into and out of the second conveying chamber 120; a lid 105 for closing the wafer carry-in/out port 104; and a pod opener 103.

The pod opener 103 includes a cap opening/closing mechanism 102 for opening and closing the cap of a pod 101 mounted on an IO stage 100. The cap opening/closing mechanism 102 opens and closes a lid 105 for closing a wafer carry-in/out port 104 as well as the cap of a pod 101. When the cap of a pod 101 mounted on an IO stage 100 and the corresponding lid 105 are opened, a wafer 200 can be loaded into and unloaded from the pod. Each pod 101 is supplied to and ejected from an IO stage 100 by an in-process carrier device (AGV: Automatic Guided Vehicle/OHT: Overhead Hoist Transfer), not shown.

Of the five side walls of the enclosure 111 of the first conveying chamber 110, as illustrated in FIG. 1, the four side walls positioned on the left and right side and the rear side are coupled with the following processing chambers: the first processing chamber 150, a second processing chamber 151, a third processing chamber 152, and the fourth processing chamber 153. The four side walls are respectively coupled with these processing chambers for carrying out desired processing on wafers 200 through gate valves 160, 161, 162, 163.

Reference numeral 108 denotes a control unit for controlling the substrate processing apparatus and it controls each component part, such as the cap opening/closing mechanism 102, notch aligner 107, and first wafer transfer device 112, comprising the substrate processing apparatus.

The processing chambers 150, 151, 152, 153 may carry out the same kind of substrate processing or may respectively carry out different kinds of substrate processing according to the purpose of the apparatus.

In the following description of the embodiments, a case where they are identical processing chambers will be taken as an example. The details of the processing chambers will be described later.

Hereafter, description will be give to the steps of substrate processing using a substrate processing apparatus configured as mentioned above. In each step of this substrate processing, the control unit 108 controls the component parts of the substrate processing apparatus.

First, a pod 101 loaded with 25 unprocessed wafers is conveyed to the substrate processing apparatus by the in-process carrier device. As illustrated in FIG. 1 and FIG. 2, the conveyed pod 101 is transferred from the in-process carrier device and mounted on an IO stage 100. The cap of the pod 101 and the lid 105 closing the corresponding wafer carry-in/out port 104 is removed by the cap opening/closing mechanism 102 to open the wafer loading/unloading port of the pod 101.

When the pod 101 is opened by the pod opener 103, the second wafer transfer device 122 installed in the second conveying chamber 120 picks up one wafer 200 from the pod 101 and mounts it on the notch aligner 107.

The notch aligner 107 moves the mounted wafer 200 in the vertical direction (X-direction and Y-direction) and the circumferential direction in a horizontal plane to adjust the notch position and the like of the wafer 200.

While the position of the first wafer 200 is being adjusted at the notch aligner 107, the second wafer transfer device 122 picks up the second wafer 200 from the pod 101 and carries it out into the second conveying chamber 120. Then it waits in the second conveying chamber 120.

After the adjustment of the position of the first wafer 200 by the notch aligner 107 is completed, the second wafer transfer device 122 picks up the first wafer 200 from the notch aligner 107. The second wafer transfer device 122 mounts the second wafer 200 held by the second wafer transfer device 122 at that time on the notch aligner 107. Thereafter, notch alignment is carried out on the second wafer 200.

Subsequently, the gate valve 130 is opened and the second wafer transfer device 122 carries the first wafer 200 into the first load lock chamber 131 and transfers it onto the temporary substrate mounting table 133. During this transferring operation, the gate valve 134 on the first conveying chamber 110 is kept closed and the negative pressure in the first conveying chamber 110 is maintained.

When the transfer of the first wafer 200 onto the temporary substrate mounting table 133 is completed, the gate valve 130 is closed and the interior of the first load lock chamber 131 is evacuated and brought into negative pressure by an exhauster (not shown).

In parallel with the exhaust of the atmosphere in the first load lock chamber 131, the second wafer transfer device 122 picks up the second wafer 200 from the notch aligner 107. When the gate valve 140 is opened, the second wafer transfer device 122 carries the second wafer 200 into the second load lock chamber 141 and transfers it onto the temporary substrate mounting table 143. Then the gate valve 140 is closed and the interior of the second load lock chamber 141 is evacuated and brought into negative pressure by an exhauster (not shown).

From then on, the second wafer transfer device 122 repeats the above operation. In case both the first load lock chamber 131 and the second load lock chamber 141 are under negative pressure at this time, the following takes place: the second wafer transfer device 122 does not carry a wafer 200 into the first load lock chamber 131 or the second load lock chamber 141; and it stops in a position immediately before the first load lock chamber 131 or the second load lock chamber 141 and waits there.

When the pressure in the load lock chamber 131 is reduced to a preset pressure value, the gate valve 134 is opened. Subsequently, the first wafer transfer device 112 of the first conveying chamber 110 picks up the first wafer 200 from the temporary substrate mounting table 133.

After the first wafer transfer device 112 picks up the first wafer 200 from the temporary substrate mounting table 133, the gate valve 134 is closed and the pressure in the load lock chamber 131 is returned to the atmospheric pressure. Then preparation for carrying the next wafer into the load lock chamber 131 is carried out.

In parallel with this, the gate valve 160 of the first processing chamber 150 is opened and the wafer transfer device 112 carries the first wafer 200 into the first processing chamber 150. Then processing gas is supplied from a gas supply device (not shown) into the first processing chamber 150 and desired processing is carried out on the first wafer 200.

When the pressure in the second load lock chamber 141 is subsequently reduced to a preset pressure value, the gate valve 144 is opened. Subsequently, the first wafer transfer device 112 of the first conveying chamber 110 picks up the second wafer 200 from the temporary substrate mounting table 143.

After the first wafer transfer device 112 picks up the second wafer 200, the gate valve 144 is closed and the pressure in the second load lock chamber 141 is returned to the atmospheric pressure. Then preparation for carrying out the next wafer into the second load lock chamber 141 is carried out.

In parallel with this, the gate valve 161 of the second processing chamber 151 is opened and the wafer transfer device 112 carries the second wafer 200 into the second processing chamber 151. Then processing gas is supplied from a gas supply device (not shown) into the second processing chamber 151 and desired processing is carried out on the second wafer 200.

From then on, the next wafers 200 are similarly carried into the third processing chamber 152 and the fourth processing chamber 153 and desired processing is carried out.

When the desired processing is completed in the first processing chamber 150, the first wafer transfer device 112 carries the wafer 200, carried out of the processing chamber 150, into the first load lock chamber 131 and mounts it on the temporary substrate mounting table 132.

In case there is an unprocessed wafer on the temporary substrate mounting table 133 in the first load lock chamber 131 at this time, the first wafer transfer device 112 carries out the following processing: it carries the unprocessed wafer out of the first load lock chamber 131 and into the first conveying chamber 110.

Then the gate valve 134 is closed and cooling of the processed wafer 200 is started in the first load lock chamber 131. At the same time, inert gas is introduced from an inert gas supply device (not shown) connected to the first load lock chamber 131 and the pressure in the first load lock chamber 131 is returned to the atmospheric pressure.

When a preset cooling time has passed in the first load lock chamber 131 and the pressure in the first load lock chamber 131 is returned to the atmospheric pressure, the gate valve 130 is opened. Subsequently, the second wafer transfer device 122 of the second conveying chamber 120 picks up the processed wafer 200 from the temporary substrate mounting table 132 and carries it out into the second conveying chamber 120 and then the gate valve 130 is closed. Thereafter, the second wafer transfer device 122 loads the processed wafer 200 into a pod 101 through a wafer carry-in/out port 104 of the second conveying chamber 120.

When desired processing has been carried out on all the wafers in a pod 101 by the above steps and 25 processed wafers are all loaded into a pod 101, the following takes place: the cap of the pod 101 and the lid 105 closing the corresponding wafer carry-in/out port 104 are closed by the pod opener 103. The closed pod 101 is conveyed from the 10 stage 100 to the next step by the in-process carrier device.

The above operation is repeated and wafers are thereby sequentially processed by 25.

Figure 3:
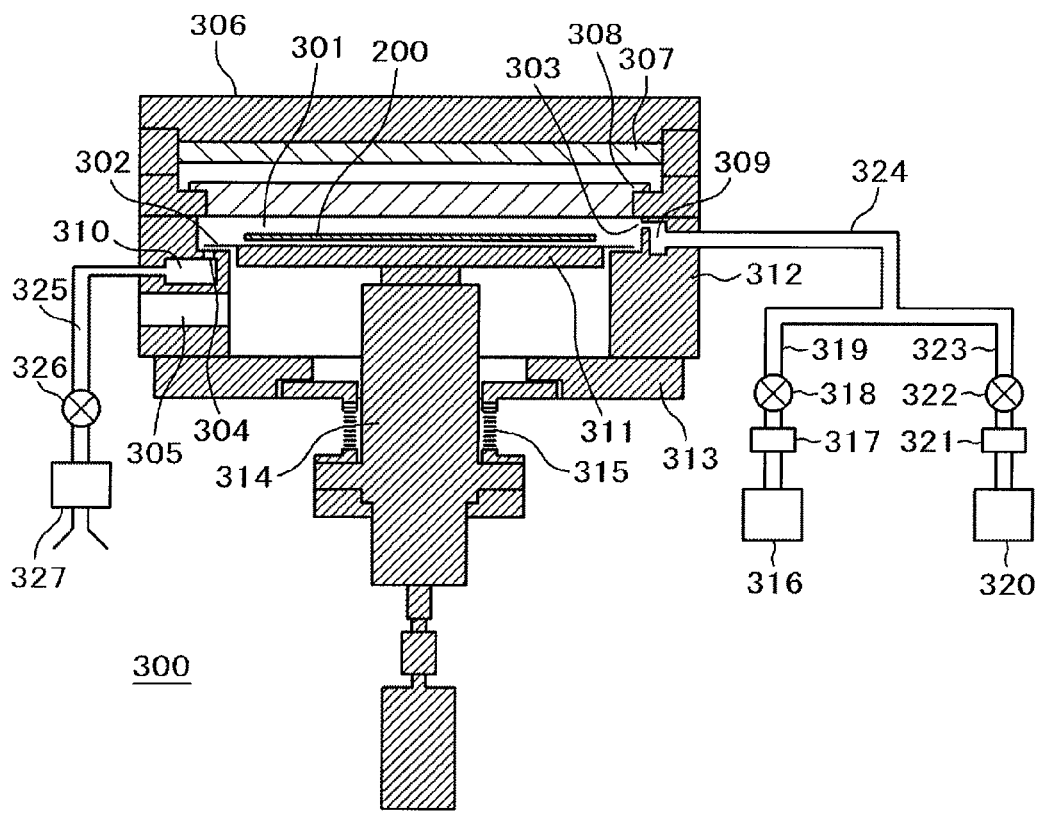
FIG. 3 is a sectional view of a processing chamber used in a substrate processing apparatus in a first embodiment of the invention as viewed sideways.
Figure 4:
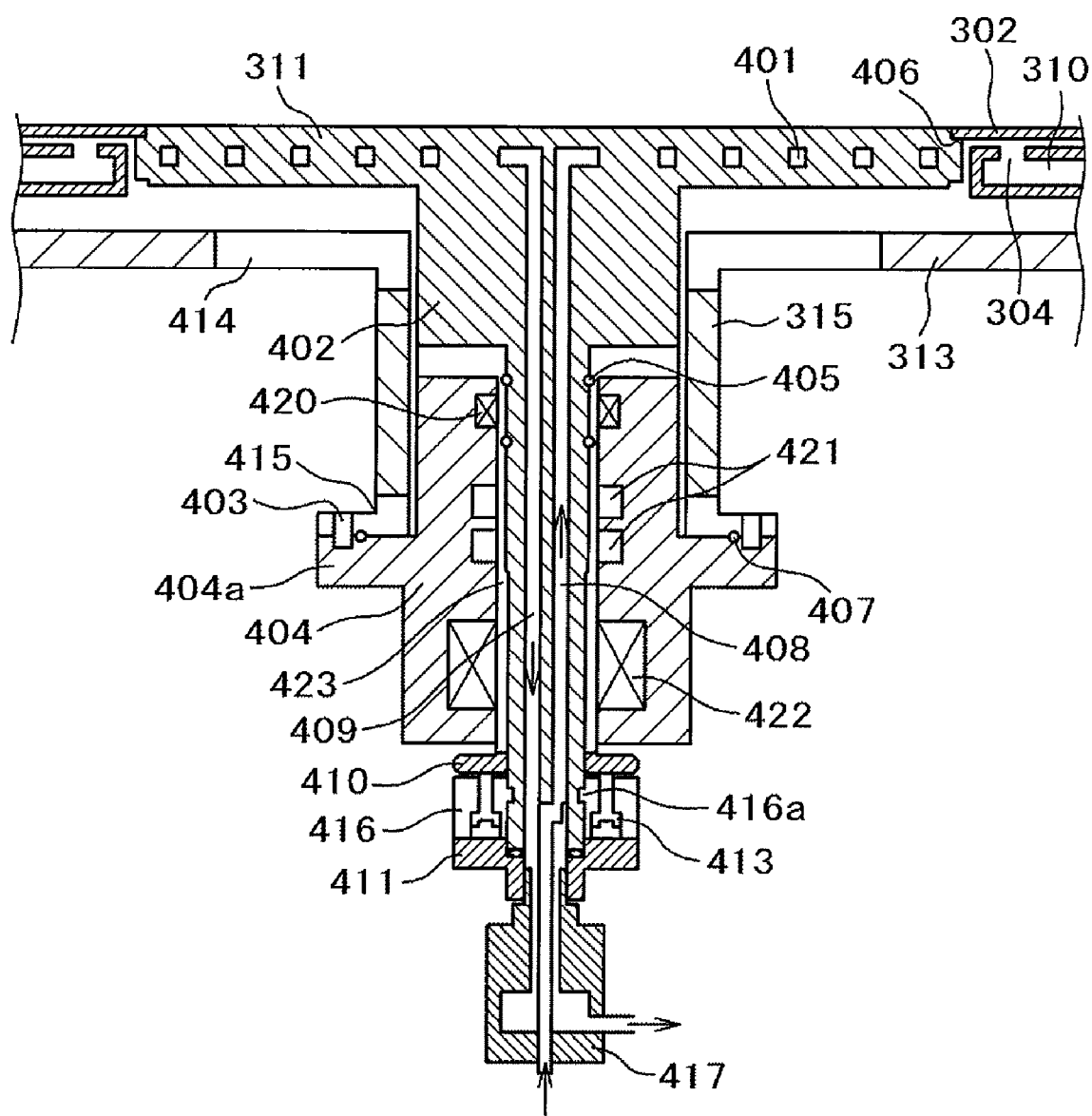
FIG. 4 is a sectional view illustrating a substrate mounting unit and a substrate mounting unit support mechanism, viewed sideways, used in a processing chamber in the first embodiment of the invention.
Figure 5:
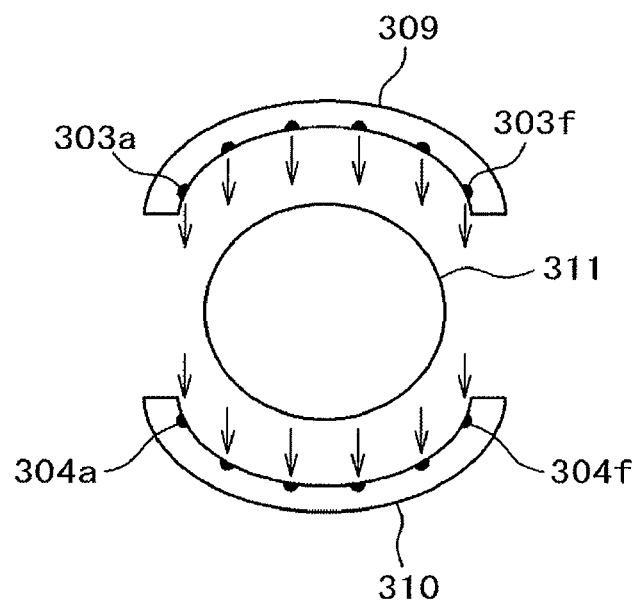
FIG. 5 is a drawing illustrating how gas is supplied into and exhausted from a processing chamber in the first embodiment of the invention.

Description will be given to the processing chambers in the first embodiment of the invention with reference to FIG. 3 to FIG. 7. FIG. 3 is a sectional view illustrating a processing chamber used in a substrate processing apparatus in the first embodiment of the invention as viewed sideways. FIG. 4 is a sectional view illustrating a substrate mounting unit and a substrate mounting unit support mechanism used in each processing chamber in the first embodiment of the invention as viewed sideways. FIG. 5 illustrates how gas is supplied and exhausted in a processing chamber in the first embodiment of the invention.

In FIG. 3, reference numeral 300 denotes a processing chamber for processing a substrate and corresponds to the above-mentioned processing chambers 150 to 153. The processing chamber 300 is comprised mainly of the exciting unit described later, chamber top wall 306, substrate mounting unit 311, chamber side wall 312, and chamber bottom wall 313.

Reference numeral 301 denotes a process area for processing a substrate. The process area 301 refers to a space that is sandwiched between the exciting unit described later and substrate mounting unit 311 and embraces a substrate processing surface.

Reference numeral 302 denotes a gas flow control ring 302 for controlling a flow of gas on a wafer (substrate) 200.

Reference numeral 303 denotes a gas supply port for supplying processing gas into the process area 301 and multiple gas supply ports are provided and arranged in a half ring shape as illustrated in FIG. 5. FIG. 5 illustrates an example in which six gas supply ports 303 are provided. Reference numerals 303a to 303f denote the individual gas supply ports.

The gas supply ports 303 adjoin to a supply gas buffer room 309 as a buffer space for temporarily storing processing gas. As illustrated in FIG. 5, the supply gas buffer room 309 forms a half ring-shaped passage in the chamber side wall 312. As illustrated in FIG. 3, the supply gas buffer room 309 is connected with a gas introduction pipe 324. The gas introduction pipe 324 is connected to a first gas supply source 316 for supplying material gas through a first gas supply pipe 319. It is also connected to a second gas supply source 320 for supplying inert gas through a second gas supply pipe 323. Since processing gas (mixed gas of material gas and inert gas) is supplied from the gas supply ports 303 through the supply gas buffer room 309, the processing gas can be evenly supplied onto a substrate.

In the first gas supply pipe 319 extended from the first gas supply source 316 to the supply gas buffer room 309, there are provided a mass flow controller 317 for controlling a gas flow rate and an on-off valve 318 in this order. The first gas supply pipe 319, first gas supply source 316, mass flow controller 317, and on-off valve 318 will be collectively designated as first gas supply unit.

In the second gas supply pipe 323 extended from the second gas supply source 320 to the supply gas buffer room 309, there are provided a mass flow controller (MFC) 321 for controlling a gas flow rate and an on-off valve 322 in this order. The second gas supply pipe 323, second gas supply source 320, mass flow controller 321, and on-off valve 322 will be collectively designated as second gas supply unit.

Further, the first gas supply unit, second gas supply unit, and gas introduction pipe 324 will be collectively designated as gas supply unit.

Reference numeral 304 denotes a gas exhaust port for exhausting processing gas from the process area 301 and multiple gas exhaust ports are provided and arranged in a half ring shape as illustrated in FIG. 5. FIG. 5 illustrates an example in which six gas exhaust ports 304 are provided. Reference numerals 304a to 304f denote the individual gas exhaust ports.

The exhaust ports 304 are connected to an exhaust buffer room 310 as a buffer space. As illustrated in FIG. 5, the exhaust buffer room 310 forms a half ring-shaped passage in the chamber side wall 312.

The exhaust buffer room 310 is connected with a gas exhaust pipe 325. The gas exhaust pipe 325 is connected to a vacuum pump 327 and an APC valve 326. The vacuum pump 327 exhausts the atmosphere in the processing room. The APC valve 326 adjusts the flow rate of exhaust to adjust the pressure in the processing room.

The gas exhaust pipe 325, vacuum pump 327, and APC valve 326 will be collectively designated as gas exhaust unit.

As illustrated in FIG. 5, the supply ports 303 of the gas supply unit and the exhaust ports 304 of the gas exhaust unit are so configured that they are opposed to each other around the substrate mounting surface of a substrate mounting unit 311. That is, the gas supply ports 303a to 303f and the gas exhaust ports 304a to 304f are so configured that they are respectively opposed to each other. In FIG. 5, for example, the supply port 303a and the exhaust port 304a are so configured that they are opposed to each other and the supply port 303f and the exhaust port 304f are so configured that they are opposed to each other.

This makes it possible to evenly supply gas to the surface of a substrate.

The substrate mounting surface is so configured that it is nestled into between the following lines: a line connecting together one end port (303a) of the supply ports 303 of the gas supply unit and one end port (304a) of the exhaust ports 304 of the gas exhaust unit opposed thereto; and a line connecting together the other end port (303f) of the supply ports of the supply unit and the other end port (304f) of the exhaust ports opposed thereto. This makes it possible to form a gas flow on a substrate without fail.

Reference numeral 305 denotes a substrate carry-in/out port through which a wafer (substrate) 200 is carried into the processing chamber 300 or carried out of the processing chamber 300.

When a wafer 200 is carried in or out, a substrate mounting unit support mechanism 314 moves down and the substrate mounting surface of the substrate mounting unit 311 and the substrate carry-in/out port 305 are brought to substantially the same height. When a wafer 200 is carried into the processing chamber, the wafer 200 is mounted on the substrate mounting surface of the substrate mounting unit 311 by the first wafer transfer device 112. When a wafer 200 is carried out of the processing chamber, conversely, the wafer 200 is picked up from the substrate mounting surface of the substrate mounting unit 311 by the first wafer transfer device 112.

Reference numeral 307 denotes a lamp for emitting vacuum ultra violet light with a wavelength of 200 nm or shorter. It is attached to the chamber top wall 306 and provided on a surface opposed to the processing surface of a wafer 200. Reference numeral 308 denotes a window made of quartz that allows vacuum ultra violet light emitted from the lamp 307 to pass through. The window 308 is located between the lamp 307 and the process area 301 and is also a partition that allows vacuum ultra violet light to pass through and prevents the atmosphere in the process area 301 from being exposed to the lamp 307.

The lamp 307 and the window 308 will be collectively designated as exciting unit for exciting processing gas.

Reference numeral 311 denotes the substrate mounting unit for mounting a wafer (substrate) 200. A substrate is mounted there so that the processing surface of the substrate is opposed to the exciting unit. Reference numeral 314 denotes the substrate mounting unit support mechanism for supporting the substrate mounting unit 311. Reference numeral 315 denotes an expandable hermetically sealing unit having bellows, which will be hereafter designated as bellows.

When the substrate mounting unit support mechanism 314 moves up and down, the substrate mounting unit 311 is thereby moved up and down. FIG. 3 illustrates a state in which the substrate mounting unit 311 has been moved up. To process a substrate, the substrate mounting unit 311 is moved up to a predetermined position as illustrated in FIG. 3.

The substrate mounting unit 311 will be described later in detail.

It is desirable that the distance between the exciting unit (specifically, the lamp 307) and the substrate mounting unit 311 should be varied according to the type of substrate processing (process).

The reason for this will be described below.

It is found that the amount of energy (vacuum ultra violet light in this example) emitted from an exciting unit varies depending on the distance between supplied gas and the exciting unit. That is, irradiation energy is low in a place distant from the exciting unit and irradiation energy is high in a place close to the exciting unit.

Therefore, for a process in which it is required to apply a larger amount of energy to processing gas, that is, a process in which it is required to increase the energy level of gas, it is desirable to take the following measure: the substrate mounting unit 311 is moved up to a position close to the exciting unit. Conversely, for a process in which it is required to apply a smaller amount of energy, that is, a process in which it is required to lower the energy level of gas, it is desirable to take the following measure: the substrate mounting unit 311 is moved up to a position distant (away) from the exciting unit to process a substrate.

Various different processes can be accommodated by varying the height position of the substrate mounting unit support mechanism 314 in substrate processing.

Subsequently, description will be given to the structure of a substrate mounting unit 311 and its peripheral part with reference to FIG. 4 and FIG. 5. FIG. 4 is a sectional view illustrating a substrate mounting unit and a substrate mounting unit support mechanism used in a processing chamber in the first embodiment of the invention as viewed sideways. FIG. 5 illustrates how gas is supplied and exhausted in a processing chamber in the first embodiment of the invention.

As illustrated in FIG. 5, the substrate mounting unit 311 is circular when viewed from above and is made of aluminum. As illustrated in FIG. 4, the substrate mounting unit 311 is provided with a coolant circulation path 401. The coolant circulation path 401 is installed throughout the substrate mounting unit 311 and is capable of evenly cooling a substrate. For the coolant, for example, Galden (registered trademark) HT200 is used.

As illustrated in FIG. 4, the circumferential edge portion (the edge portion of the circumferential portion) 406 of the substrate mounting unit 311 is provided with a recessed portion (counterbore). The inner circumferential edge portion (the edge portion of the inner circumferential portion) of the gas flow control ring 302 is fit into the recessed portion from above. The gas flow control ring 302 is made of aluminum.

When the substrate mounting unit support mechanism 314 is in the down position, the gas flow control ring 302 is mounted on the gas exhaust ports 304 and waits. In process of the ascent of the substrate mounting unit support mechanism 314 to the substrate processing position, the inner circumferential end of the gas flow control ring 302 is fit into the counterbore in the circumferential edge portion 406. Then the substrate mounting unit support mechanism 314 and the gas flow control ring 302 move up together.

After the substrate mounting unit support mechanism 314 moves up to a predetermined position, the gas flow control ring 302 stops above the gas exhaust ports 304 with a predetermined space left between it and the gas exhaust ports 304. At this time, the outer circumferential edge (the edge portion of the outer circumferential portion) of the gas flow control ring 302 leaves a predetermined distance between it and the wall of the supply gas buffer room 309. The substrate mounting unit support mechanism 314 includes the shaft 402, rotational drive unit 404, connecting unit, and coolant supply/discharge unit 417 shown in FIG. 4. These component parts will be described later.

In substrate processing, it is desirable that the height of the surface of the gas flow control ring 302 and the height of the surface of a wafer 200 should be equal to each other. This makes the gas flow velocity in proximity to the gas flow control ring 302 equal to the gas flow velocity in the central part of the substrate. That is, the peripheral part and central part of the substrate are equal to each other in gas flow velocity. Therefore, the film formation speed within the plane of the substrate is equalized and the evenness of film thickness is enhanced.

Gas supplied from the gas supply ports 303 is applied onto the wafer 200. Thereafter, it is exhausted from the surface of the gas flow control ring 302 through the exhaust ports 304 positioned on the back side of the gas flow control ring 302. The gas is exhausted by way of the space between the supply gas buffer room 309 and the gas flow control ring 302.

The processing gas is prevented from flowing from the outer circumferential end of the wafer 200 toward the substrate mounting unit support mechanism 314 by the gas flow control ring 302. It horizontally flows from the outer circumferential end of the wafer 200 and is exhausted. Therefore, it is possible to evenly exhaust gas as compared with cases where the gas flow control ring 302 is not provided and thus the surface of the substrate can be evenly processed. In addition, wasteful consumption of processing gas can be suppressed by the gas flow control ring 302 and thus the reproducibility of a gas flow is enhanced.

Provision of the gas flow control ring 302 makes it possible to make a gas flow uniform even though the height of the substrate mounting unit 311 is changed. For this reason, a gas flow can be made uniform even though the height of the substrate mounting unit 311 is changed to accommodate various different processes and different processes can be easily accommodated.

Description will be given to the shaft 402, rotational drive unit 404, and the like comprising the substrate mounting unit support mechanism 314 with reference to FIG. 4 to FIG. 7.

The shaft 402 is a support unit for supporting the substrate mounting unit 311. The shaft 402 includes a coolant (cooling material) flow path. This coolant flow path allows coolant supplied to the coolant circulation path 401 in the substrate mounting unit 311 to flow and allows coolant discharged from the coolant circulation path 401 to flow. The material of the shaft 402 is aluminum. The horizontal sections of the shaft 402 are circular. As the coolant flow path included in the shaft 402, the following paths are provided: a first coolant supply path 408 for supplying coolant from the coolant supply/discharge unit 417 to the coolant circulation path 401; and a first coolant discharge path 409 that allows coolant discharged from the coolant circulation path 401 to flow. As illustrated in FIG. 4, the first coolant supply path 408 and the first coolant discharge path 409 are provided in the shaft 402 so that they are parallel with each other and at a distance from each other.

Reference numeral 404 denotes a rotational drive unit for horizontally rotating the shaft 402 and is made of SUS (stainless steel). The side surface of the shaft 402 is covered with a hollow shaft 423. The hollow shaft 423 supports the shaft 402 by surrounding it and is horizontally rotated together with the shaft 402 and protects the shaft 402 from friction arising from rotation and the like. The material of the hollow shaft 423 is SUS. An O-ring 405 is provided between the shaft 402 and the hollow shaft 423. The O-ring 405 prevents the shaft 402 from wobbling and prevents gas from leaking from the process area 301. The rotational drive unit 404 is provided on the side where it is in contact with the hollow shaft 423 with a magnetic fluid seal 420 as a vacuum seal, a bearing 421, and a motor 422. Rotary motion of the motor 422 is transmitted to the hollow shaft 423 and as a result, the shaft 402 is horizontally rotated.

A flange 404a provided on the casing of the rotational drive unit 404 is provided with a lower bellows fixture 415 for fixing the bellows 315. The lower bellows fixture is fastened by a fastening tool 403 such as a screw. An O-ring 407 prevents gas from leaking from the process area 301.

Reference numeral 414 denotes an upper bellows fixture for fixing the bellows 315 at its upper part. The upper bellows fixture 414 is fastened to the chamber bottom wall 313.

Figure 6:
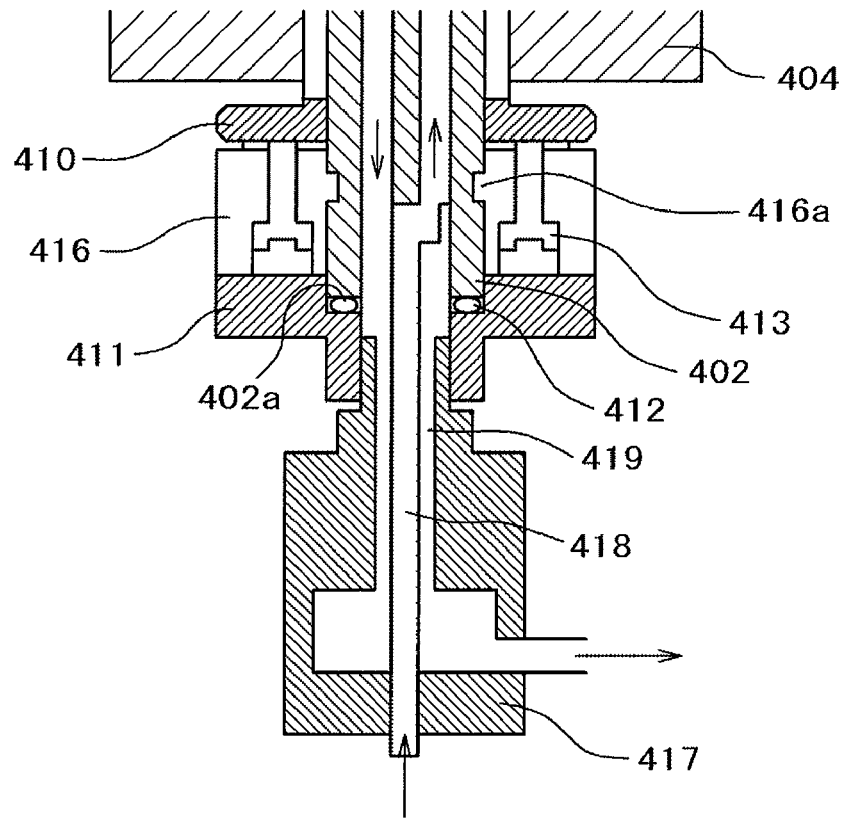
FIG. 6 is an enlarged view of the connecting unit and the coolant supply/discharge unit illustrated in FIG. 4.
Figure 7:
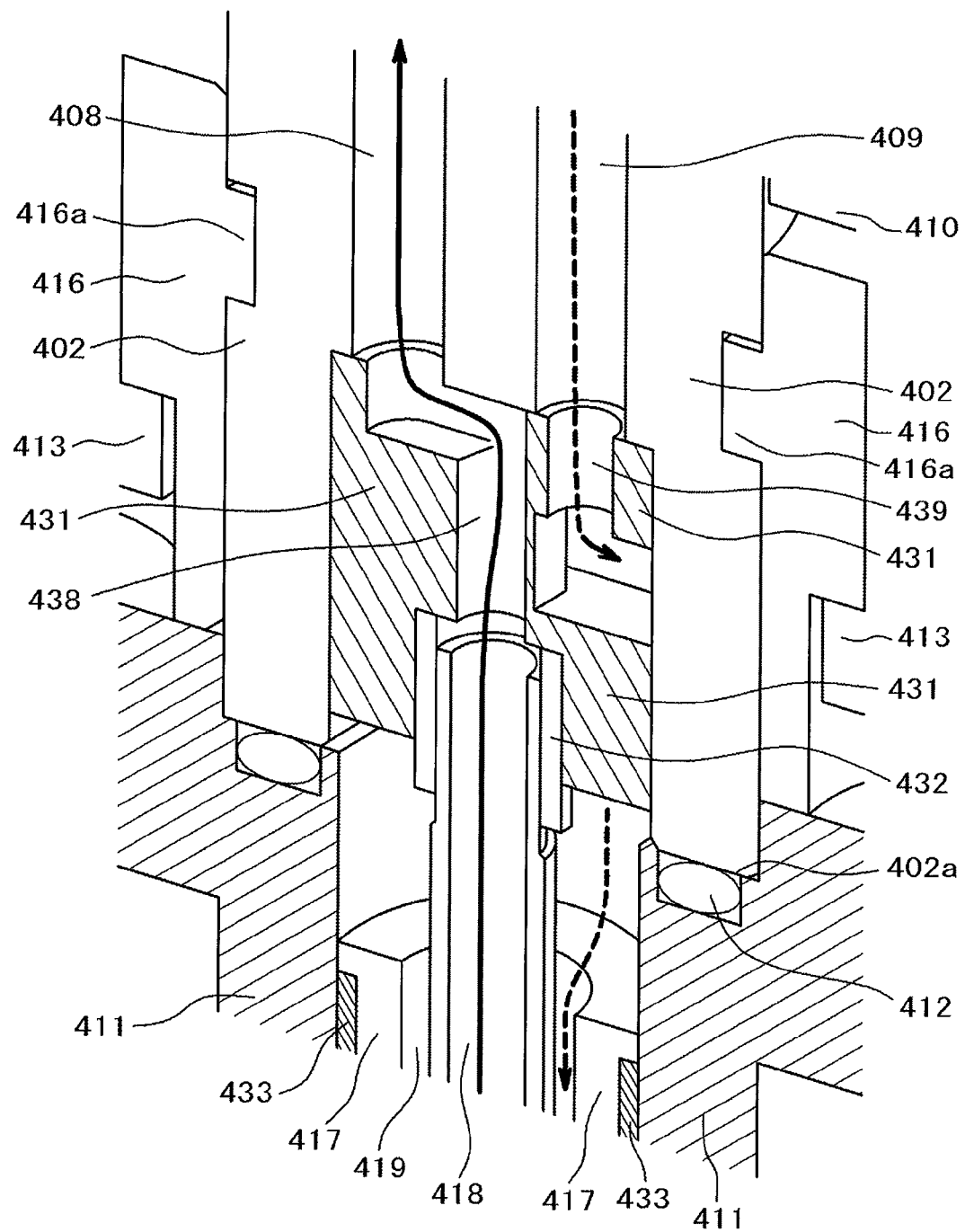
FIG. 7 is a drawing illustrating the structure of the connecting unit and the coolant supply/discharge unit illustrated in FIG. 6.

Description will be given to the connecting unit provided at the tip of the lower part of the shaft 402 and the coolant supply/discharge unit 417 located under the connecting unit with reference to FIG. 6 and FIG. 7. FIG. 6 is an enlarged view of the connecting unit and coolant supply/discharge unit 417 illustrated in FIG. 4. FIG. 7 illustrates the structure of the connecting unit and coolant supply/discharge unit 417 illustrated in FIG. 6.

As illustrated in FIG. 6, the tip of the lower part of the shaft 402 is inserted into a shaft receiving unit 411. A securing ring 416 is provided above the shaft receiving unit 411 and a retaining ring 410 is provided above the securing ring 416. As illustrated in FIG. 7, a flow path conversion block 431 is installed inside the tip of the lower part of the shaft 402. The shaft receiving unit 411, securing ring 416, retaining ring 410, and flow path conversion block 431 are all made of SUS. The shaft receiving unit 411, securing ring 416, retaining ring 410, and flow path conversion block 431 form a connecting unit connecting the shaft 402 and the coolant supply/discharge unit 417 together and is horizontally rotated together with the shaft 402.

As illustrated in FIG. 6, the coolant supply/discharge unit 417 is provided under the shaft receiving unit 411. When the shaft 402 is horizontally rotated, the coolant supply/discharge unit 417 is not horizontally rotated and remains at rest. As illustrated in FIG. 7, a bush (buffer material) 433 is provided between the shaft receiving unit 411 and the coolant supply/discharge unit 417. The bush 433 is not horizontally rotated. The bush 433 is made of fluorine resin, such as Teflon (registered trademark).

The coolant supply/discharge unit 417 is made of SUS. The coolant supply/discharge unit 417 has a rotor built in its casing. It supplies coolant to the shaft 402 through the connecting unit without leakage and discharges coolant from the shaft 402 through the connecting unit without leakage. The coolant supply/discharge unit 417 is provided with a second coolant supply path 418 and a second coolant discharge path 419. The second coolant discharge path 419 is disposed concentrically with the second coolant supply path 418 so that it surrounds the second coolant supply path 418. That is, the second coolant supply path 418 is an inner shaft and the second coolant discharge path 419 is an outer shaft so provided that it surrounds the inner shaft. As mentioned above, the second coolant supply path 418 and the second coolant discharge path 419 form a double shaft. As understood from FIG. 7, the shaft receiving unit 411 is horizontally rotated around this double shaft. Even during rotation, therefore, it can supply coolant from the inner shaft and discharge coolant from the outer shaft.

The leakage of coolant is prevented by abutting the tip 402a of the shaft 402 against an O-ring 412 as illustrated in FIG. 7. The flow path conversion block 431 installed inside the tip of the lower part of the shaft 402 connects together the coolant flow paths in the shaft 402 and the coolant flow paths in the coolant supply/discharge unit 417. More specific description will be given. The first coolant supply path 408 in the shaft 402 and the second coolant supply path 418 in the coolant supply/discharge unit 417 are connected together through the flow path conversion block 431. The first coolant discharge path 409 in the shaft 402 and the second coolant discharge path 419 in the coolant supply/discharge unit 417 are connected together through the same.

As illustrated in FIG. 7, the first coolant supply path 408 and first coolant discharge path 409 in the shaft 402 are so disposed that they are parallel with and at a distance from each other. In the coolant supply/discharge unit 417, meanwhile, the second coolant discharge path 419 is disposed concentrically with the second coolant supply path 418 so that it surrounds the second coolant supply path 418. Thus the coolant flow paths in the shaft 402 are not provided with a double shaft structure but are so structured that they are parallel with and distant from each other. This facilitates the fabrication of the shaft 402.

As illustrated in FIG. 7, a third coolant supply path 438 in the flow path conversion block 431 is connected with the second coolant supply path 418 in the coolant supply/discharge unit 417. This connection is carried out through a bush (buffer material) 432 at the lower end of the flow path conversion block 431. The bush 432 is not horizontally rotated. The bush 432 is made of fluorine resin, such as Teflon (registered trademark). A third coolant discharge path 439 in the flow path conversion block 431 is connected with the second coolant discharge path 419 in the coolant supply/discharge unit 417 at the lower end of the flow path conversion block 431.

The third coolant supply path 438 in the flow path conversion block 431 is connected with the first coolant supply path 408 in the shaft 402 at the upper end of the flow path conversion block 431. The third coolant discharge path 439 in the flow path conversion block 431 is connected with the first coolant discharge path 409 in the shaft 402 at the upper end of the flow path conversion block 431. In the flow path conversion block 431, as mentioned above, the coolant flow paths in the shaft 402 parallel with each other are converted into the double concentric coolant flow paths in the coolant supply/discharge unit 417.

As illustrated in FIG. 6, the securing ring 416 is provided on the upper surface of the shaft receiving unit 411. The securing ring 416 is in the shape of ring (doughnut) having thickness in the vertical direction and is so structured that it can be divided into substantially bilaterally-symmetrical two along the vertical direction. The two-divided pieces of the securing ring 416 are laterally fit onto the side surface of the tip of the shaft 402. The securing ring 416 is provided with a flange 416a as a protruded portion. With the flange 416a fit in a recess in the side surface of the tip of the shaft 402, the two-divided pieces of the securing ring 416 are coupled and fixed together by a bolt (not shown) in the horizontal direction. As a result, the securing ring 416 is fixed on the shaft 402. The shaft receiving unit 411 is secured on the securing ring 416 by a bolt or the like (not shown). Provided with this structure, the shaft receiving unit 411 is rotated together with the shaft 402.

The retaining ring 410 is pressed against the hollow shaft 423 by a fastening tool 413, such as a bolt, from the lower surface side (the securing ring 416 side) and fixed there. The vertical position of the shaft 402 is made constant by the retaining ring 410.

The tip 402a of the shaft 402 is fit into the shaft receiving unit 411. With this structure, the horizontal position of the shaft 402 is made constant by the securing ring 416. Therefore, when the shaft 402 is rotated together with the connecting unit including the shaft receiving unit 411, the shaft 402 is prevented from wobbling in the horizontal direction and further the shaft 402 is prevented from lifting in the vertical direction.

This makes constant the distance between the substrate mounting unit 311 and the exciting unit; therefore, it is possible to carry out stable film formation processing and make even the film thickness in the plane of a substrate.

With the connecting unit (retaining ring 410, securing ring 416, shaft receiving unit 411, flow path conversion block 431) removed, the shaft 402 is just inserted into the hollow shaft 423. Therefore, the shaft 402 can be removed from the hollow shaft 423 by pulling it out from above. Since the O-ring 405 is fit in a groove formed in the shaft 402, it does not interfere with the attachment/detachment of the shaft 402.

Description will be given to the operation in substrate processing using a processing chamber in this embodiment. The operation of each of the following component parts is controlled by the control unit 108.

First, the substrate mounting unit support mechanism 314 is moved up and down and its position is adjusted so that the substrate mounting unit 311 is brought to substantially the same height as the substrate carry-in/out port 305.

Next, a wafer (substrate) 200 is carried into the processing chamber by the first wafer transfer device 112 and the wafer 200 is mounted on the substrate mounting surface of the substrate mounting unit 311.

After the wafer 200 is mounted on the substrate mounting surface of the substrate mounting unit 311, the substrate mounting unit support mechanism 314 (shaft 402, rotational drive unit 404, connecting unit, coolant supply/discharge unit 417) is moved up to a predetermined position. In process of this ascent, the inner circumferential end of the gas flow control ring 302 is fit in the recessed portion (counterbore) in the circumferential edge portion 406 of the substrate mounting unit. Then the substrate mounting unit 311 and the gas flow control ring 302 are moved up together.

The connecting unit between the coolant supply/discharge unit 417 at rest and the rotatable shaft 402 is so disposed that the following does not take place: when the substrate mounting unit support mechanism 314 is moved up to a predetermined position, the connecting unit is not positioned higher than the chamber bottom wall 313. That is, the connecting unit is so disposed that when the substrate mounting unit 311 is moved up to a predetermined position, it does not get into the processing chamber.

Adoption of this structure in which the connecting unit does not get into the processing chamber makes it possible to prevent the leakage of coolant into the processing chamber even though the coolant leaks from the connecting unit.

After the substrate mounting unit 311 moves up to the predetermined height and starts horizontal rotation, material gas is supplied from the gas supply unit. When material gas is supplied, the following measure may be taken: material gas is supplied from the first gas supply unit and in parallel, carrier gas, such as inert gas, is supplied from the second gas supply unit.

When material gas is supplied and gas is simultaneously exhausted form the gas exhaust unit, the pressure in the processing chamber is kept at a predetermined value. At this time, the supplied gas goes from the surface of the wafer 200 and flows along the surface of the gas flow control ring 302 and is exhausted by way of the exhaust ports 304.

In parallel with the material gas supply, vacuum ultra violet light is emitted from the lamp 307. Gas thereby excited is adsorbed onto the wafer 200 and a film is formed. The evenness in film thickness can be enhanced by forming a gas flow from the supply ports 303 to the exhaust ports 304 while the substrate mounting unit 311 is rotated. When desired substrate processing is completed, the first gas supply unit stops the supply of material gas and the substrate mounting unit 311 stops rotation. Inert gas is supplied form the second gas supply unit and at the same time, the exhaust unit exhausts the atmosphere in the processing chamber. Thus the atmosphere in the processing chamber is replaced with an inert atmosphere.

After the replacement of the atmosphere in the processing chamber or during the replacement processing, the substrate mounting unit support mechanism 314 moves down. Then the position of the substrate mounting unit 311 is controlled so that the substrate mounting unit 311 and the substrate carry-in/out port 305 become substantially equal to each other in height. After the substrate mounting unit 311 moves down, the gate valve 160 between the first conveying chamber 110 and the processing chamber 300 is opened. The processed wafer 200 is carried out of the processing chamber 300 by the first wafer transfer device 112.

Hereafter, description will be given to the maintenance of the processing chambers of the invention.

When film formation processing, such as CVD processing, is carried out, a film is also formed on the window 308, substrate mounting unit 311, and the like in each processing chamber 300. As a result, particles adhere to the window 308, substrate mounting unit 311, and the like. If processing is continued with particles kept adhered, the particles can peel off and adhere to a substrate. To prevent this, it is required to remove the component parts, such as the window 308, substrate mounting unit 311, and the like, from each processing chamber and carry out maintenance including cleaning and the like.

Each exciting unit, including a chamber top wall 306, a lamp 307, and a window 308, is integrally moved up by an elevating mechanism, not shown, for maintenance and is removed from the corresponding processing chamber 300.

In cluster-type apparatuses described with reference to FIG. 1 or FIG. 2, adjacent processing chambers are positioned very closely to each other and it is difficult to horizontally shift the upper lid or the like of a processing chamber to be removed to remove it. Therefore, each exciting unit is once moved up by the elevating mechanism for maintenance as mentioned above and then removed.

Description will be given to the removal of each substrate mounting unit 311 and each shaft 402.

First, the coolant supply/discharge unit 417 is moved downward and then the shaft receiving unit 411 is removed from the securing ring 416. Thereafter, the fastening tool 413 is removed from beneath and then the securing ring 416 is removed. Subsequently, the flow path conversion block 431 is removed. Next, the retaining ring 410 is removed. Thus the shaft receiving unit 411, securing ring 416 is removed, flow path conversion block 431, and retaining ring 410 are removed from the shaft 402 and as a result, the fixture of the shaft 402 in the vertical direction is released.

Since the shaft 402 has been inserted into the hollow shaft 423, the shaft 402 is moved up and removed from the hollow shaft 423. It is assumed that at this time, the gas flow control ring 302 has been removed.

As mentioned above, the shaft 402 is simply configured so that it is fixed only in a vertical position; therefore, it can be removed from the processing chamber 300 by pulling it out. Therefore, it is possible to remove the substrate mounting unit 311 and the shaft 402 in a short time.

Up to this point, the invention has been described. However, the exciting unit may be replaced as described below.

Figure 8:
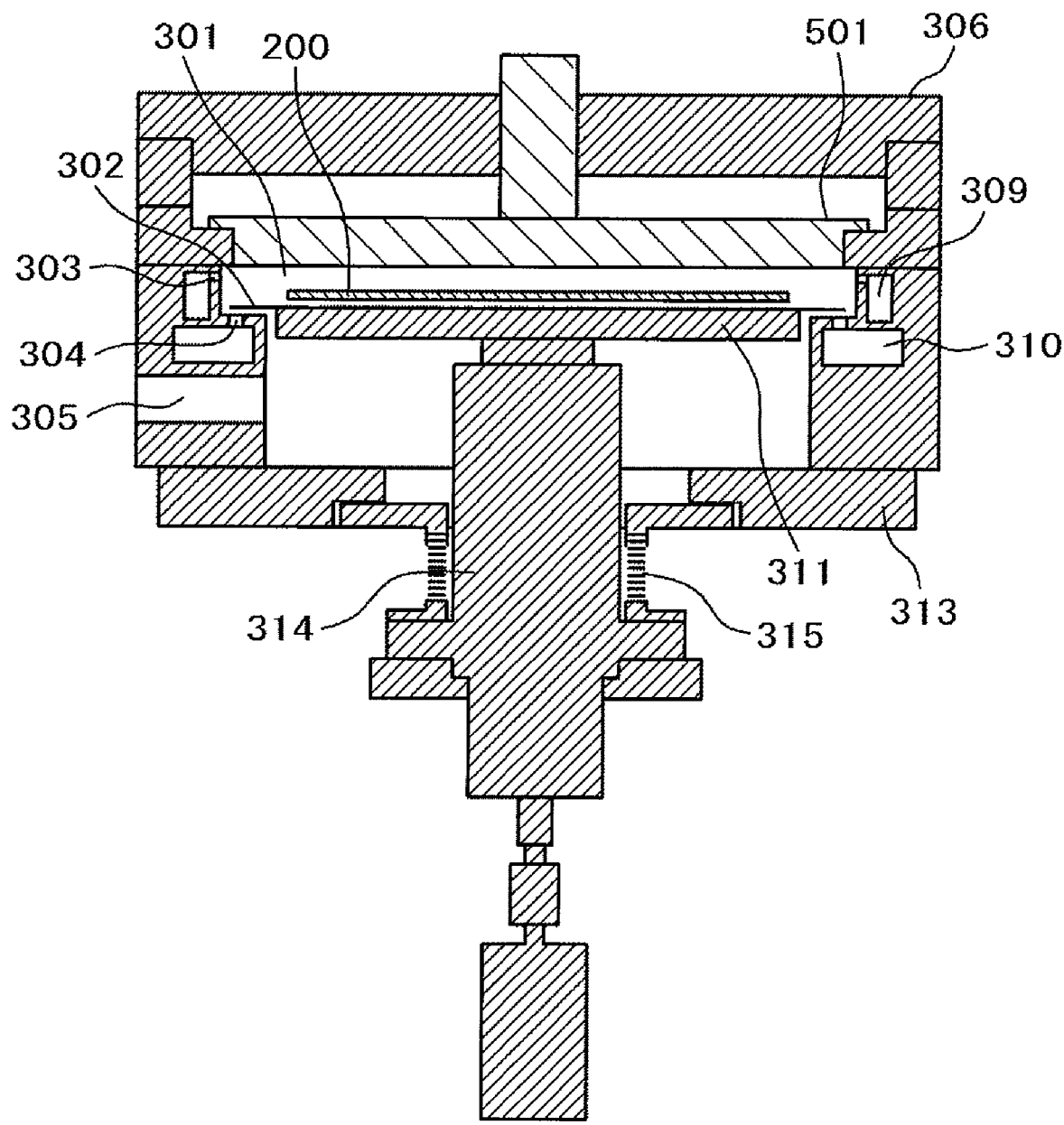
FIG. 8 is a sectional view of a processing chamber used in a substrate processing apparatus in a second embodiment of the invention as viewed sideways.

As illustrated in FIG. 8, for example, the exciting unit may be replaced with a microwave irradiation part 501.

Supplied gas is irradiated with a microwave by the microwave irradiation part 501 and the gas is thereby excited.

Figure 9:
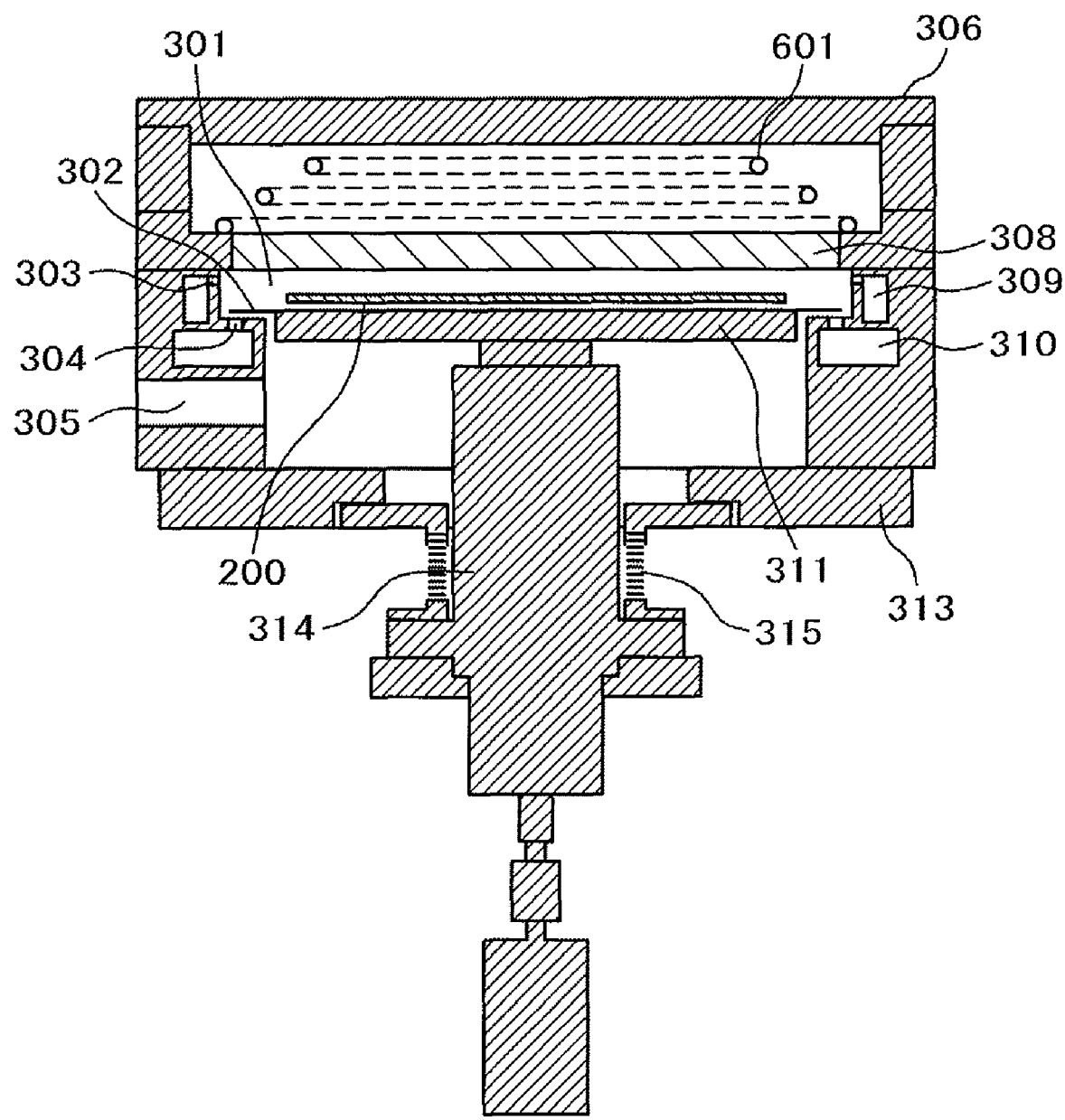
FIG. 9 is a sectional view of a processing chamber used in a substrate processing apparatus in a third embodiment of the invention as viewed sideways.

As illustrated in FIG. 9, a coil 601 may be used as the exciting unit.

Supplied gas is excited by the coil 601 and processes a substrate.

According to the invention, as mentioned up to this point, the evenness of film thickness in the plane of a substrate can be enhanced.

In the above description, multiple gas supply ports 303 are arranged in a half ring shape on the gas introduction pipe 324 side to supply material. However, the invention is not limited to this and multiple supply ports may be arranged in a ring shape all around the substrate mounting unit. In conjunction with this, the supply gas buffer room 309 can be provided similarly with the gas supply port 303, not in a half ring shape. That is, the supply gas buffer room can be provided in a position corresponding to the gas supply ports 303 all around the substrate mounting unit. In the above-mentioned embodiments, gas is laterally supplied to a substrate. However, the invention is not limited to this and gas may be supplied from above a substrate using a showerhead. In this case, the showerhead is made of, for example, quartz so that vacuum ultra violet light emitted from the lamp 307 can pass through. The energy of ultra violet light passing through the showerhead varies from place to place by the influence of the gas supply ports provided in the showerhead. Use of the showerhead, nevertheless, makes it possible to evenly supply gas onto each substrate as compared with cases where gas is laterally supplied to each substrate.

When gas is laterally supplied to a substrate, as in the above embodiments, there is not an obstacle between the ultra violet light transmission window and a substrate. Therefore, vacuum ultra violet light energy can be evenly applied as compared with cases where gas is supplied from a showerhead.

In the above embodiments, the gas exhaust ports 304 are arranged in a half ring shape on the gas exhaust pipe 325 side so that the following is implemented: they are opposed to the gas supply ports 303 with the substrate mounting surface of the substrate mounting unit 311 in-between. However, the invention is not limited to this and the gas exhaust ports may be arranged in a ring shape all around the substrate mounting unit. Instead of the gas exhaust ports, for example, slits may be provided and gas may be exhausted from the slits.

This specification contains at least the following aspects of the invention. A first aspect of the invention is a substrate processing apparatus including:

a processing chamber for processing a substrate mounted on a substrate mounting unit;

a supply unit for supplying processing gas to the processing chamber;

an exciting unit for exciting supplied processing gas;

an exhaust unit for exhausting the atmosphere in the processing chamber;

a support unit that supports the substrate mounting unit;

a rotational drive unit for horizontally rotating the support unit; and a coolant supply/discharge unit that is connected to the lower end of the support unit through a connecting unit and is not horizontally rotated.

The substrate mounting unit has a coolant circulation path therein.

The support unit includes a first coolant supply path for supplying coolant to the coolant circulation path and a first coolant discharge path for discharging coolant from the coolant circulation path.

The coolant supply/discharge unit includes a second coolant supply path and a second coolant discharge path.

The connecting unit connects together the first coolant supply path and the second coolant supply path and connects together the first coolant discharge path and the second coolant discharge path.

The connecting unit is provided outside the processing chamber.

When the substrate processing apparatus is configured as mentioned above, it is possible to prevent the leaking coolant from entering a processing chamber under vacuum even though coolant leaks.

A second aspect of the invention is the substrate processing apparatus according to the first aspect in which:

the exciting unit is provided opposite to the substrate mounting surface of the substrate mounting unit; and a supply port of the supply unit and an exhaust port of the exhaust unit are so configured that they are opposed to each other around the substrate mounting surface.

When the substrate processing apparatus is configured as mentioned above, it is possible to evenly supply gas to the surface of a substrate.

A third aspect of the invention is the substrate processing apparatus according to the second aspect in which:

the substrate mounting surface is disposed between the following lines: a line connecting together one end supply port of the supply ports of the supply unit and one end exhaust port of the exhaust ports opposed thereto; and a line connecting together the other end supply port of the supply ports of the supply unit and the other end exhaust port of the exhaust ports opposed thereto.

When the substrate processing apparatus is configured as mentioned above, it is possible to form a gas flow on a substrate without fail.

A fourth aspect of the invention is the substrate processing apparatus according to the second aspect or the third aspect in which:

the supply unit includes a buffer space adjacent to the supply ports.

When the substrate processing apparatus is configured as mentioned above, the flow velocity of supply gas can be adjusted by providing the buffer space.

A fifth aspect of the invention is the substrate processing apparatus according to any of the second to fourth aspects in which:

the exciting unit is a lamp that emits vacuum ultra violet light.

Gas is increased in its amount that is turned into activated species (radical) with increase in the amount of received vacuum ultra violet light. For this reason, in case of processing in which gas flowing on a substrate is in a laminar flow and vacuum ultra violet light is applied, the following takes place: the amount that is turned into activated species is larger downstream of the gas flow. When a vacuum ultra violet light lamp is used, therefore, the in-plane evenness of a formed film is enhanced by rotating a substrate mounting unit and forming a laminar flow of gas.

A sixth aspect of the invention is the substrate processing apparatus according to any of the first to fifth aspects in which:

the substrate mounting surface of the substrate mounting unit is provided at its circumferential end with a recessed portion into which a gas flow control ring is fit.

When the substrate processing apparatus is configured as mentioned above, the following takes place: processing gas is prevented from flowing from the outer circumferential end of a substrate toward the substrate mounting unit support mechanism by the gas flow control ring. As a result, the gas horizontally flows from the outer circumferential end of the substrate and is exhausted. Therefore, it is possible to evenly exhaust gas as compared with cases where no gas flow control ring is provided and thus evenly process the surface of a substrate.

A seventh aspect of the invention is the substrate processing apparatus according to any of the first to sixth aspects in which:

the first coolant supply path and first coolant discharge path in the support unit form flow paths distant from and parallel with each other;

the second coolant supply path and second coolant discharge path in the coolant supply/discharge unit form double shaft-like flow paths; and the connecting unit converts the flow paths in the support unit distant from and parallel with each other into the double shaft-like flow paths in the coolant supply/discharge unit.

When the substrate processing apparatus is configured as mentioned above, it is possible to easily connect together the horizontally rotatable support unit and the coolant supply/discharge unit at rest.

An eighth aspect of the invention is semiconductor devices manufacturing apparatus including:

a processing chamber for carrying out film formation processing on a semiconductor substrate mounted on a substrate mounting unit;

a supply unit for supplying processing gas to the processing chamber;

an exciting unit for exciting supplied processing gas;

an exhaust unit for exhausting the atmosphere in the processing chamber;

a support unit that supports the substrate mounting unit;

a rotational drive unit for horizontally rotating the support unit; and a coolant supply/discharge unit that is connected to the lower end of the support unit through a connecting unit and is not horizontally rotated.

The substrate mounting unit has a coolant circulation path therein.

The support unit includes a first coolant supply path for supplying coolant to the coolant circulation path and a first coolant discharge path for discharging coolant from the coolant circulation path.

The coolant supply/discharge unit includes a second coolant supply path and a second coolant discharge path.

The connecting unit connects together the first coolant supply path and the second coolant supply path and connects together the first coolant discharge path and the second coolant discharge path.

The connecting unit is provided outside the processing chamber.

When the semiconductor devices manufacturing apparatus is configured as mentioned above, it is possible to prevent the leaking coolant from entering a processing chamber under vacuum even though coolant leaks.

A ninth aspect of the invention is a substrate processing method for a substrate processing apparatus including: a processing chamber for processing a substrate mounted on a substrate mounting unit; a supply unit for supplying processing gas to the processing chamber; an exciting unit for exciting supplied processing gas; an exhaust unit for exhausting the atmosphere in the processing chamber; a support unit that supports the substrate mounting unit; a rotational drive unit for horizontally rotating the support unit; and a coolant supply/discharge unit that is connected to the lower end of the support unit through a connecting unit and is not horizontally rotated, the substrate mounting unit having a coolant circulation path therein, the support unit including a first coolant supply path for supplying coolant to the coolant circulation path and a first coolant discharge path for discharging coolant from the coolant circulation path, the coolant supply/discharge unit including a second coolant supply path and a second coolant discharge path, the connecting unit connecting together the first coolant supply path and the second coolant supply path and connecting together the first coolant discharge path and the second coolant discharge path; and the connecting unit being provided outside the processing chamber.

The substrate processing method includes the steps of
carrying a substrate into the processing chamber;
supplying processing gas into the processing chamber;
circulating coolant in the substrate mounting unit and horizontally rotating the substrate mounting unit;
exciting processing gas to process the substrate; and
carrying the substrate out of the processing chamber.

When the substrate processing method is configured as mentioned above, it is possible to prevent the leaking coolant from entering a processing chamber under vacuum even though coolant leaks.

A 10th aspect of the invention is a semiconductor devices manufacturing method for a substrate processing apparatus including: a processing chamber for carrying out film formation processing on a semiconductor substrate mounted on a substrate mounting unit; a supply unit for supplying processing gas to the processing chamber; an exciting unit for exciting supplied processing gas; an exhaust unit for exhausting the atmosphere in the processing chamber; a support unit that supports the substrate mounting unit; a rotational drive unit for horizontally rotating the support unit; and a coolant supply/discharge unit that is connected with the lower end of the support unit through a connecting unit and is not horizontally rotated, the substrate mounting unit having a coolant circulation path therein, the support unit including a first coolant supply path for supplying coolant to the coolant circulation path and a first coolant discharge path for discharging coolant from the coolant circulation path, the coolant supply/discharge unit including a second coolant supply path and a second coolant discharge path, the connecting unit connecting together the first coolant supply path and the second coolant supply path and connecting together the first coolant discharge path and the second coolant discharge path, and the connecting unit being provided outside the processing chamber.

The semiconductor devices manufacturing method includes the steps of:
carrying a semiconductor substrate into the processing chamber;
supplying processing gas into the processing chamber;
circulating coolant in the substrate mounting unit and horizontally rotating the substrate mounting unit;
exciting processing gas to carry out film formation processing on the substrate; and
carrying the substrate out of the processing chamber.

When the semiconductor devices manufacturing method is configured as mentioned above, it is possible to prevent the leaking coolant from entering a processing chamber under vacuum even though coolant leaks.

This U.S. non-provisional patent application claims priority under 35 U.S.C. §119 of Japanese Patent Application Nos. 2009-200668, filed on Aug. 31, 2009, and 2010-144975, filed on Jun. 25, 2010, in the Japanese Patent Office, the entire contents of which are hereby incorporated by reference.

What is claimed is:

1. A substrate processing apparatus comprising:
a processing chamber for processing a substrate mounted on a substrate mounting unit;
a supply unit for supplying processing gas to the processing chamber;
an exciting unit for exciting supplied processing gas;
an exhaust unit for exhausting the atmosphere in the processing chamber;
a support unit that supports the substrate mounting unit;
a rotational drive unit for horizontally rotating the support unit; and
a coolant supply/discharge unit that is connected with the lower end of the support unit through a connecting unit and is not horizontally rotated,
wherein the substrate mounting unit has a coolant circulation path therein,
wherein the support unit includes a first coolant supply path for supplying coolant to the coolant circulation path and a first coolant discharge path for discharging coolant from the coolant circulation path,
wherein the coolant supply/discharge unit includes a second coolant supply path and a second coolant discharge path,
wherein the connecting unit connects together the first coolant supply path and the second coolant supply path and connects together the first coolant discharge path and the second coolant discharge path, and
wherein the connecting unit is provided outside the processing chamber.

2. The substrate processing apparatus according to claim 1,
wherein the exciting unit is provided opposite to the substrate mounting surface of the substrate mounting unit, and
wherein the supply ports of the supply unit and the exhaust ports of the exhaust unit are so configured that the supply ports and the exhaust ports are opposed to each other around the substrate mounting surface.

3. The substrate processing apparatus according to claim 2,
wherein the substrate mounting surface is disposed between a line connecting together one end supply port of the supply ports of the supply unit and one end exhaust port of the exhaust ports opposed thereto and a line connecting together the other end supply port of the supply ports of the supply unit and the other end exhaust port of the exhaust ports opposed thereto.

4. The substrate processing apparatus according to claim 3,
wherein the supply unit has a buffer space adjacent to the supply ports.

5. The substrate processing apparatus according to claim 4,
wherein the exciting unit is a lamp emitting vacuum ultra violet light.

6. The substrate processing apparatus according to claim 3,
wherein the exciting unit is a lamp emitting vacuum ultra violet light.

7. The substrate processing apparatus according to claim 2,
wherein the exciting unit is a lamp emitting vacuum ultra violet light.

8. The substrate processing apparatus according to claim 2,
wherein the supply unit has a buffer space adjacent to the supply ports.

9. The substrate processing apparatus according to claim 8,
wherein the exciting unit is a lamp emitting vacuum ultra violet light.

10. The substrate processing apparatus according to claim 1,
wherein the exciting unit is a lamp emitting vacuum ultra violet light.

11. The substrate processing apparatus according to claim 1,
wherein the first coolant supply path and first coolant discharge path in the support unit form flow paths distant from and parallel with each other,
wherein the second coolant supply path and second coolant discharge path in the coolant supply/discharge unit form double shaft-like flow paths, and
wherein the connecting unit converts the flow paths in the support unit distant from and parallel with each other into the double shaft-like flow paths in the coolant supply/discharge unit.

12. The substrate processing apparatus according to claim 11,
wherein the exciting unit is a lamp emitting vacuum ultra violet light.

13. A semiconductor devices manufacturing method for a substrate processing apparatus including: a processing chamber for carrying out film formation processing on a semiconductor substrate mounted on a substrate mounting unit; a supply unit for supplying processing gas to the processing chamber; an exciting unit for exciting supplied processing gas; an exhaust unit for exhausting the atmosphere in the processing chamber; a support unit that supports the substrate mounting unit; a rotational drive unit for horizontally rotating the support unit; and a coolant supply/discharge unit that is connected with the lower end of the support unit through a connecting unit and is not horizontally rotated, the substrate mounting unit having a coolant circulation path therein, the support unit including a first coolant supply path for supplying coolant to the coolant circulation path and a first coolant discharge path for discharging coolant from the coolant circulation path, the coolant supply/discharge unit including a second coolant supply path and a second coolant discharge path, the connecting unit connecting together the first coolant supply path and the second coolant supply path and connecting together the first coolant discharge path and the second coolant discharge path, and the connecting unit being provided outside the processing chamber, the semiconductor devices manufacturing method comprising the steps of:
carrying a semiconductor substrate into the processing chamber;
supplying processing gas into the processing chamber;
circulating coolant in the substrate mounting unit and horizontally rotating the substrate mounting unit;
exciting processing gas to carry out film formation processing on the substrate; and
carrying the substrate out of the processing chamber.

* * * * *